SEMICONDUCTOR SWITCHING DEVICE WITH EMITTER GATE

Filed Dec. 19, 1966

3 Sheets-Sheet 1

INVENTORS:
JAMES E. McINTYRE,
DANTE E. PICCONE,
ISTVAN SOMOS,

BY Albert S. Richardson Jr.
ATTORNEY

SEMICONDUCTOR SWITCHING DEVICE WITH EMITTER GATE
Filed Dec. 19, 1966 3 Sheets-Sheet 2
FIG. 7.
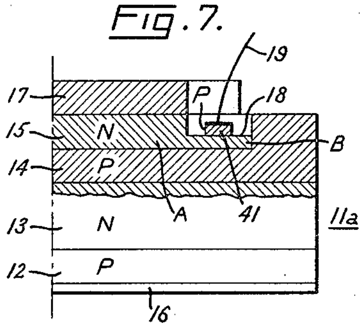
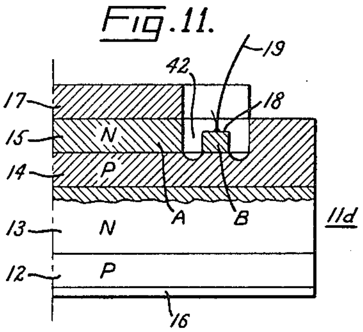
FIG. 8.
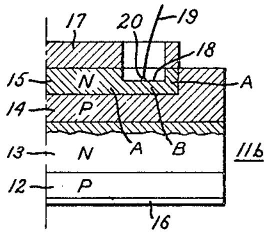
FIG. 15.
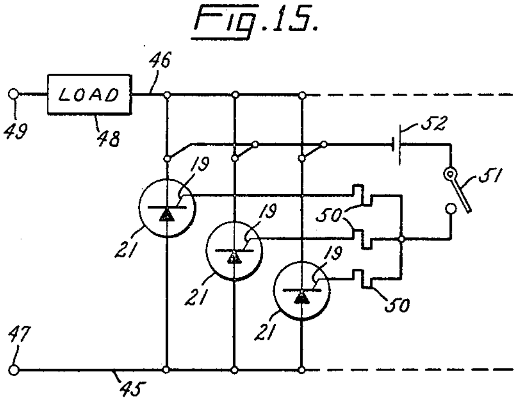
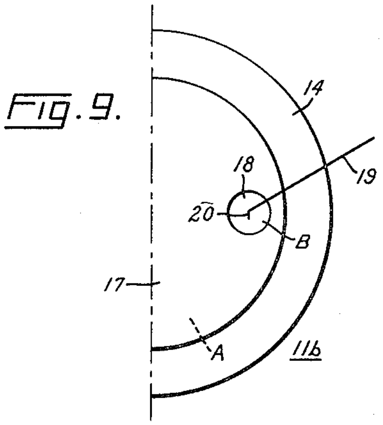
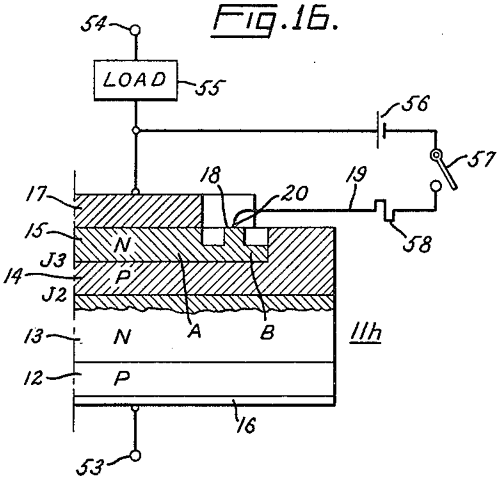
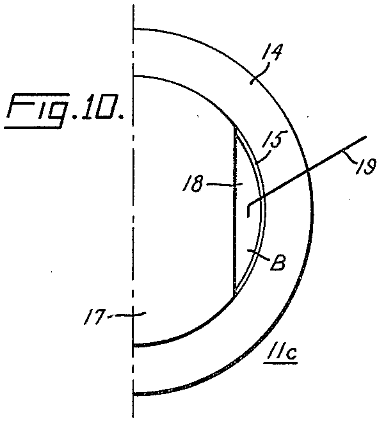
INVENTORS:
JAMES E. McINTYRE,
DANTE E. PICCONE,
ISTVAN SOMOS,
BY Albert S. Richardson Jr.
ATTORNEY

SEMICONDUCTOR SWITCHING DEVICE WITH EMITTER GATE

Filed Dec. 19, 1966 3 Sheets-Sheet 3

INVENTORS:
JAMES E. McINTYRE,
DANTE E. PICCONE,
ISTVAN SOMOS,

BY Albert S. Richardson Jr.
ATTORNEY

United States Patent Office 3,489,962
Patented Jan. 13, 1970

3,489,962

SEMICONDUCTOR SWITCHING DEVICE WITH EMITTER GATE

James E. McIntyre, Crum Lynne, Dante E. Piccone, Philadelphia, and Istvan Somos, Drexel Hill, Pa., assignors to General Electric Company, a corporation of New York Filed Dec. 19, 1966, Ser. No. 602,837
Int. Cl. H01l *11/00, 15/00*
U.S. Cl. 317—235 29 Claims

ABSTRACT OF THE DISCLOSURE

We have discovered that high-power solid-state PNPN switching devices having unusually short turn-on delay times and low turn-on voltages can be practically produced simply by providing in one of the end layers of the device a relatively high lateral resistance region that is free of main electrode connections and by moving the conventional triggering means to the exposed face of this region.

This invention relates generally to solid-state electric current switches of the multilayer semiconductor type, and more particularly it relates to a high power silicon controlled rectifier (known generally as a thyristor or SCR) having improved switching characteristics.

Typically an SCR comprises a thin, broad area disc-like body having four distinct layers of semiconductor material (silicon), with contiguous layers being of different conductivity types to form three back-to-back PN (rectifying) junctions in series. A pair of main current-carrying electrodes (anode and cathode) are provided in low resistance (ohmic) contact with the outer surfaces of the respective end layers of the silicon body, and for triggering conduction between these electrodes the body is normally equipped with at least one control electrode (gate contact). To complete the device the silicon body is sealed in an insulating housing, and it can be externally connected to associated electric power and control circuits by means of its main and control electrodes.

When connected in series with a load impedance and a source of forward bias voltage, an SCR will ordinarily block appreciable current flow between its anode and cathode until a small gate current of suitable magnitude and duration is supplied to the control electrode, whereupon it abruptly switches from a high impedance to a very low impedance, forward conducting (turned on) state. Subsequently the device reverts to its blocking (turned off) state in response to load current being reduced below a given holding level.

The SCR's of primary interest herein are those having relatively high power ratings: when off they can successively block high reverse voltages of the order of 2,000 peak reverse volts; when on they can normally conduct high forward currents of the order of 250 amperes (average) or more. Of interest also are high frequency (e.g., 3,000 Hz.) SCR's of lesser voltage ratings (e.g., 300 PRV). The conventional construction and operating theory of such devices are well known in the art, as are their limitations.

One of the recognized limitations of conventional SCR's is their inability safely to endure very high rates of rise of anode current (the inrush current slope, or *di/dt*) during the turn on process. The maximum allowable *di/dt* decreases with increasing forward voltage ratings and with increasing switching frequencies. And the turn-on *di/dt* duty that is imposed on a conventional SCR can adversely affect its turn-off time. Fortunately, however, this shortcoming can be overcome in large measure by practicing the teachings of a copending patent application Ser. No. 514,734—DeCecco, Piccone and Somos, now U.S. Patent No. 3,408,545, and assigned to the assignee of the present application. As there pointed out, it has been observed that when gated SCR's of known construction are triggered, load current conduction invariably starts in a "pinpoint" area adjacent to the gate contact. This is where the device fails if subjected to too high a *di/dt*. In order to expedite the spread of current from this initial microplasma to the full area of a high power device before the current density and localized heating can reach destructively high levels therein, DeCecco et al. have proposed an electrode-less auxiliary region in one end layer of the device, which region is physically disposed between the main electrode connected to that end layer and the gate contact and is characterized by a lateral resistance sufficiently high to cause some of the current that initially traverses this region immediately to transfer to a parallel path in the adjoining layer where it acts as a relatively high energy trigger signal for the broad area portion of the semiconductor body subtending the main electrode. By utilizing this double-triggering construction, dramatic increases in *di/dt* ratings have been realized, and turn-off characteristics have also been improved.

The referenced construction has the additional beneficial result of enabling the minimum rise time of an SCR to be shortened. Rise time, which is one part of the total time required to switch an SCR from a forward blocking state to a conducting state, may be defined as the time that elapses while forward anode-to-cathode voltage across the triggered device is decreasing from 90% to 10% of its original value. The other part of the overall turn-on time is known as delay time ($t_d$), which may be defined as the initial length of time required after a stepped trigger signal is applied to the control electrode of the device for anode voltage to drop to its 90% level. A general object of the present invention is to provide further improvements in a high current, high voltage SCR, whereby it can be turned on with the same or better *di/dt* capability and with an even shorter delay time than any prior art device heretofore available.

In many applications it would be advantageous to have a high voltage SCR that can turn on extremely fast even if biased by a forward anode voltage that is unusually low (e.g., 0.8 volt anode-to-cathode). It is almost objective of our invention to provide such a device.

The minimum forward bias voltage at which an SCR can be successfully turned on with a trigger signal of reasonable magnitude will be hereinafter referred to as "turn-on voltage" ($V_{on}$). Turn-on voltages under 0.9 volt have been difficult to obtain in conventional high voltage SCR's because the semiconductor bodies of such devices need to have comparatively thick internal (base) layers. For example, a typical device rated 1,800 PRV might have an internal N layer that is approximately 10 mils thick contiguous with an internal P layer that is approximately 2 mils thick. Such thicknesses are not compatible with low magnitudes of $V_{on}$. For the same reason it has been difficult to obtain extremely small values of $t_d$ in such high voltage devices.

A low turn-on voltage is particularly important in extra high current applications wherein two or more SCR's are connected in electrically parallel relationship so as to share equally the total load current. While theoretically all of the paralleled devices can be simultaneously triggered, there is in practice a real possibility that one will turn on or fire slightly before the remainder, in which event the forward voltage on the latter then collapses and becomes equal to the low forward drop across the first one fired. Usually the device with the lowest turn-on voltage tends to turn on first. Unless and until the forward voltage across this device exceeds the turn-on voltages of the slower devices, the rest of the parallel combination will not turn on. Any appreciable delay in turning on the slower devices might result in failure of the first fired device if the imposed *di/dt* is more than the first device alone can safely absorb, and if the delay lasts longer than the duration of the trigger signal, the slower devices will never turn on. Hence both an extremely short delay time and the lowest possible turn-on voltage are desirable, and another object of our invention is to provide novel means for obtaining this result in a high voltage device.

SCR's having higher *di/dt* capabilities, shorter delay times, and lower turn-on voltages are desirable in other contexts too. Such characteristics make it possible to reduce costs and to increase efficiency in the manufacture and the operation of the associated control circuits that supply trigger signals to the device. Short delay times and low turn-on voltage are generally useful in static inverter applications and where zero voltage switching is required, and high *di/dt* capability can significantly prolong the life of a device so endowed. Thus improvements in these characteristics are important design goals in the trade.

One of the general objects of the present invention is to reduce the delay time and the turn-on voltage of a solid state controlled rectifier.

Another object of this invention is to provide an improved controlled rectifier in which all of the above-reviewed attributes can be realized to a surprisingly high degree by overdriving the gate. To "overdrive" the gate is to supply it with substantially more than the critical magnitude of gate current needed to just trigger the device.

A more specific object of our invention is the provision of an SCR having significantly improved electrical characteristics that are obtainable by a comparatively simple mechanical modification of a previously available production design.

Yet another object is the provision of improved SCR's that can be profitably produced in large quantities and that are characterized by consistently short delay times and uniformly low turn-on voltages.

A further object is the provision of a new SCR that lends itself to being triggered by applying to its control electrode a gate voltage of either positive or negative polarity.

In carrying out our invention in one form, we utilize an SCR built in accordance with the teaching of the above-mentioned copending application of DeCecco et al. and we modify it in a manner that will now be summarized. Instead of connecting the control electrode to one of the intermediate layers of the four-layer semiconductor body, we connect it to an exposed face of the auxiliary region of the same end layer to which one of the main electrodes is connected. We join the control electrode to a limited area of the exposed face by at least one rectifying contact, by which we mean a connection between a control electrode and the semiconductor body that is intended to behave like a non-linear resistor having initially a relatively high resistance that becomes low as the applied voltage increases. (In other words, the term "rectifying contact" distinguishes our structure from the common prior art practice of joining metal to semiconductor material by means of low resistance, ohmic contacts, such as is shown, for example, in U.S. Patent 3,006,067—Anderson et al. and in this context the words "non-ohmic" and "rectifying" are hereinafter used interchangeably.) Preferably the control electrode comprises a metallic wire which directly contacts the exposed face of the semiconductor auxiliary region to thereby form a small-area non-ohmic junction therewith. In addition, we construct and arrange this auxiliary region so that the electrical resistance between the control electrode contact and the one main electrode is appreciably higher than the lateral resistance of the auxiliary region of the DeCecco et al. device. Preferably the latter modification is accomplished by etching or abrading a portion of the outer surface of the prior auxiliary region to remove an appreciable amount of semiconductor material, whereby the material remaining under the exposed face of our auxiliary region is very thin (e.g., 0.4 mil).

In the foregoing manner we have been able to make improved SCR's rated 250 A., 1800 PRV which under normal conditions consistently turn on with a $t_d$ under 0.3 microsecond when their control electrodes are energized by a 15-volt, 1-amp source of steep rising positive trigger signals. The same devices can also be successively triggered at subnormal forward bias voltages as low as 0.8 volt. They are further characterized by extremely good turn-on *di/dt* capabilities. We have also been able to make devices having even lower turn-on voltages when fired by negative trigger signals.

Our invention will be better understood and its various objects and advantages will be more fully appreciated from the following description taken in conjunction with the accompanying drawings in which.

Figure 1:
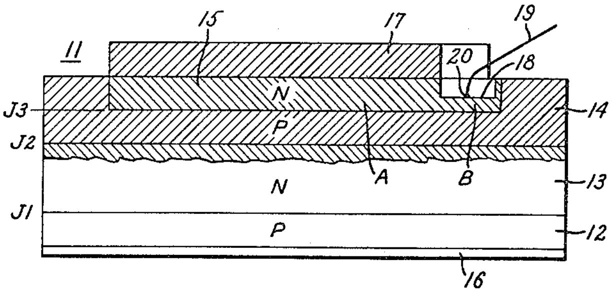
FIG. 1 is an elevational view, partly in section and not to scale, of a semiconductor switching device constructed in accordance with one form of our invention.
Figure 4:
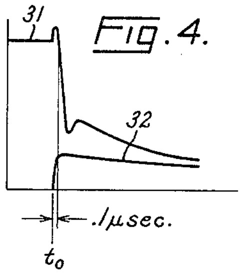
Figure 6A:
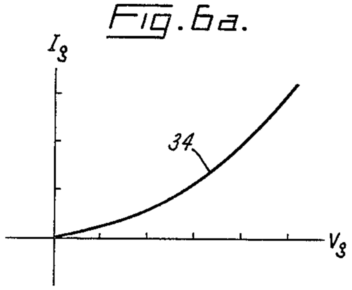
Figure 5:
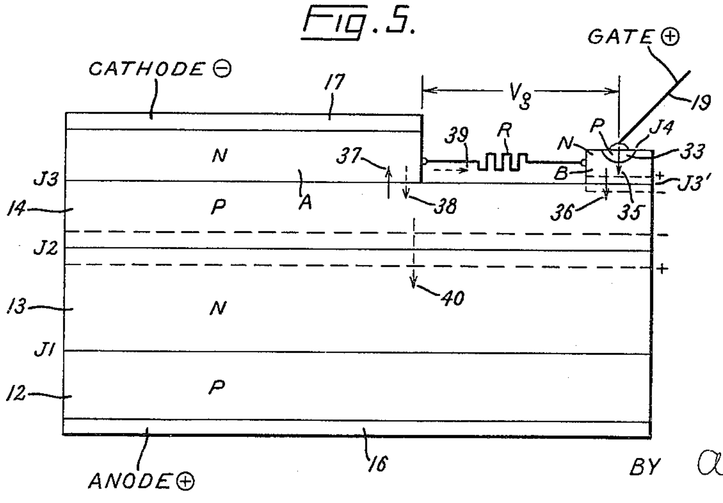
Figure 6B:
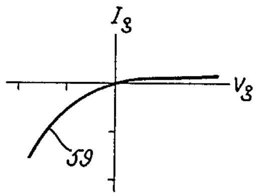
Figure 12:
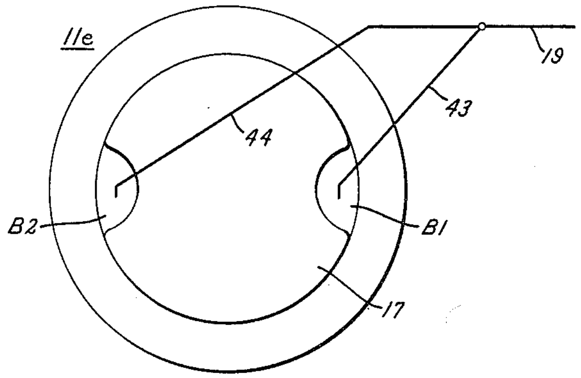
Figure 13:
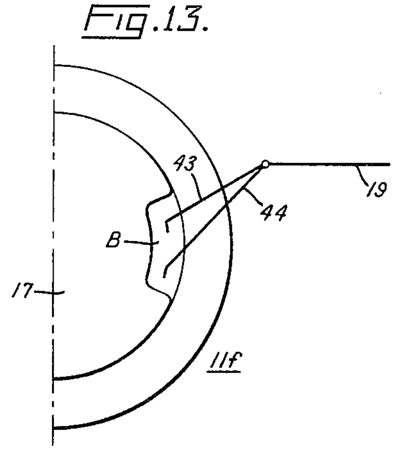
Figure 14:
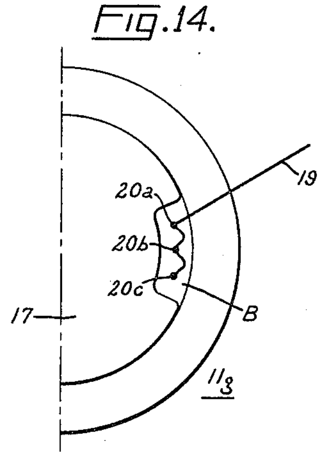

FIG. 4 a graph of voltage vs. time illustrating the extremely short delay time of a device made according to our invention;

FIG. 5 is a hybrid diagram of a semiconductor device embodying our invention;

FIGS. 6*a* and 6*b* are typical gate-cathode current vs. voltage characteristics of devices embodying our invention;

FIG. 7 is a partial elevational view, similar to FIG. 1, of a modified form of the invention;

FIG. 8 is a similar view of a device embodying an alternative form of the invention;

FIG. 9 is a plan view of the device shown in FIG. 8;

FIG. 10 is a partial plan view of a presently preferred form of the invention;

FIG. 11 is a partial elevational view of another form of the invention;

FIG. 12 is a plan view of a different species of the invention;

FIGS. 13 and 14 are partial plan views of two other embodiments of our invention;

FIG. 15 is a schematic diagram of an electric circuit wherein at least three of our devices are connected in parallel relation to each other; and FIG. 16 is a partial side elevation of yet another embodiment, with external circuits shown connected thereto.

Figure 2:
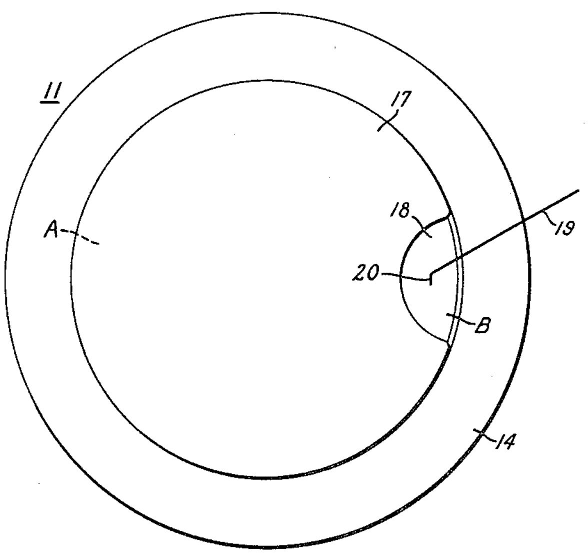
FIG. 2 is a plan view of the device shown in FIG. 1.

Referring now to FIGS. 1 and 2, we have shown a disc-like asymmetrical conductive body 11 comprising four layers or zones 12, 13, 14, and 15 of semiconductor material (preferably silicon) arranged in succession between a pair of spaced-apart metallic main electrodes 16 and 17. Contiguous layers of the body 11 are of different conductivity types, and their interface boundaries thereby form rectifying junctions J1, J2, and J3, respectively. More particularly, as is shown in FIG. 1, the lower end layer 12 of the body 11 is of P-type conductivity, the contiguous internal layer 13 is of N-type conductivity, the next intermediate layer 14 is of P-type conductivity, and the upper end layer 15 is of N-type conductivity. One of the main electrodes 16 is ohmically connected to the P-type end layer 12 and is referred to as an anode of the illustrated device, while the companion main electrode 17 is similarly connected to the opposite N-type end layer 15 and is referred to as a cathode.

Although in the drawings its thickness has been exaggerated for the sake of clarity, the PNPN body 11 is really quite thin, e.g., approximately 18 mils. On the other hand, the diameter of the body typically is relatively large, e.g., 1.16 inches. Thus each of the three rectifying junctions J1, J2, and J3 that are serially disposed between anode 16 and cathode 17 has a broad area. While the various junctions within the illustrated device have been depicted in FIG. 1 by solid horizontal lines, those skilled in the art will understand that actually these boundaries are not such discretely definable plane surfaces.

The above-described device can be constructed by any of a number of different techniques that are well known in the semiconductor are today. For example, a known diffusion process can be used to form the two P-type layers 12 and 14 in a thin wafer of N-type bulk material comprising phosphorous-doped silicon having a resistivity of approximately 60 ohm-centimeters. During this process sufficient acceptor impurities (e.g., gallium) are diffused into opposite sides of the wafer to convert about 4 mils of the bulk material to P-type conductivity, the surface concentration of gallium being $10^{19}$ atoms per cubic centimeter. Subsequently, by alloying a thin disk of 99.5-percent gold and 0.5-percent antimony to the P-type layer 14 of the silicon body, and N-type end layer and adjoining cathode are simultaneously formed. This step of the process can be so controlled that the donor impurities (antimony) reconvert a portion 15 of the layer 14 to N-type conductivity for a depth of approximately 2 mils. the regrown layer 15 having a substantially uniform concentration of $10^{18}$ antimony atoms per cubic centimeter. Thus the lateral area of the junction J3 will be as large as that of the end layer 15 which is coextensive therewith. The remainder of the gold-antimony disk comprises the cathode 17 which consequently is in broad area ohmic contact with the N-type layer 15. During the same alloying step, a broad area ohmic junction can be obtained between the P-type end layer 12 of the silicon body and a conforming layer 16 of aluminum foil or the like, which layer herein is referred to as the anode of the device. In practice a thicker substrate of tungsten or molybdenum or the like is usually bonded to the bottom surface of this anode.

In practicing our invention, a predetermined one of the semiconductor end layers of the above-described device is divided into at least two juxtaposed regions that are disposed laterally adjacent to each other. In FIGS. 1 and 2 the end layer 15 has been so divided into first and second regions which hereinafter will be referred to as the main region A and auxiliary region B of this layer. Both regions are contiguous with the intemediate P-type layer 14 of the body 11 that adjoins the end layer 15. The main region A has a major face of relatively broad area in ohmic contact with the cathode 17 which is coextensive therewith; this region is the only part of the end layer 15 that touches the cathode. The adjacent auxiliary region B, which is shown smaller than the main region A, has an exposed minor face 18 that is free of cathode connections.

In accordance with our invention, the device 11 is triggered (turned on) by means impinging directly and only on the exposed face 18 of the auxiliary region B of the end layer 15. Any conventional triggering means is suitable. For example, electromagnetic radiation, more partiularly infrared light, has been successfully employed. At present, however, we prefer and have illustrated triggering means that comprises a metallic control electrode 19 connected by way of at least one non-ohmic contact to a limited area of the auxiliary region B that is spaced apart from the nearest edge or border of the main region A. The auxiliary region B is so constructed and arranged that the lateral resistance between the control electrode contact 20 and the main region A is appreciably higher than that of any adjacent section of the main region having a lateral dimension corresponding to the shortest distance between the area of contact 20 and the bordering main region. While this result can be obtained by altering the electrical properties of the auxiliary region B relative to the main region A, we prefer to obtain it by geometry effects.

As shown in FIGS. 1 and 2, the auxiliary region B extends laterally from a peripheral border of the adjoining main region A, and to increase its lateral resistance the thickness of the auxiliary region has been materially reduced. Thus the main and auxiliary regions have discretely different thicknesses, with the latter being thinner than the former. (The "thickness" of the region refers to its dimension parallel to the direction of principal current flow between the anode 16 and the cathode 17 of the device, and "lateral" refers to a direction oriented perpendicular thereto.)

Preferably the thinner auxiliary region B is formed by etching or abrading a portion of the original outer surface of the end layer 15 to remove an appreciable amount of semiconductor material comprising this layer, whereby the remaining material is disposed under an etched-out recess and its thickness consequently is reduced. As can be clearly seen in FIG. 1, the material remaining under the removed portion of layer 15 constitutes the auxiliary region B, and its exposed face 18 is depressed but still generally parallel with respect to the plane of the major face of the adjoining main region A. Since the surface portion of the semiconductor layer 15 in contact with the overlaying gold cathode 17 has a lower resistivity (higher impurity concentration and less tightly bound majority carriers) than the homogenous material comprising the monocrystal interior of this same layer, where this N+ outer surface is removed by etching the remaining material (auxiliary region B) will be characterized by a resistivity appreciably higher than that of the original material (main region A). This then is one means for increasing the electrical resistance between the main region A and the part of auxiliary region B that subtends the limited area of contact with the control electrode 19.

It will be apparent that the auxiliary region B has been formed generally in accordance with the prior teachings of the above-mentioned copending application of DeCecco et al. However, in practice there are two important differences. We reduce the thickness of the auxiliary region and increase the transverse sheet resistance of its surface substantially more than is necessary to successfully practice the DeCecco et al. invention, and we space the auxiliary region from the perimeter of the end layer 15 so that there is negligible etching of semiconductor material anywhere in the vicinity of the external edge of the rectifying (PN) junction J3 between this layer and the adjoining layer 14 of the body 11. The latter result can be obtained by masking the edge of J3 with wax or the like after the gold over the auxiliary region B has been removed but before the silicon etchant is used.

The control electrode 19, which is illustrated in FIGS. 1 and 2 as an elongated metallic conductor, makes direct contact with the depressed minor face 18 of the auxiliary region B of the end layer 15. Preferably the conductor 19 comprises an aluminum wire that is bonded by ultrasonic welding to the face 18 of the auxiliary region to form at least one small-area non-ohmic metal-to-semiconductor contact 20 therewith. Alternatively, if desired, the pointed end of a thin metal probe could be axially pressed against the face 18 to form a point contact thereon. In either case, due to the relatively low elevation of the face 18, the control electrode contact 20 is disposed in the proximity of the intermediate P-type layer 14 of the body 11 as shown.

The face 18 of the auxiliary region B extends laterally at least ten mils beyond the periphery of the limited area on which the triggering means 19 impinges in all directions. Thus there is a peripheral area of the minor face 18 surrounding the area of contact 20, and this peripheral area is barren in the sense that it is free of any effective connections to either the main region A or the control electrode 19. As a result, the contact 20 is set back from the perimeter or edge of the face 18, and consequently it is remote from the nearest exposed edge of the PN junction J3. This discourages gate current between contact 20 and cathode 17 from bypassing the auxiliary region B by way of the relatively low-resistance exterior surface of the P-type semiconductor layer 14 or the exposed interface between the adjoining layers 14 and 15, and the desired high electric resistance is therefore ensured between the main region A and the part of the auxiliary region subtending the control electrode contact. As illustrated in FIG. 2, the border between the main and auxiliary regions has been given a concave shape so that an appreciable length thereof is substantially equidistantly spaced from the area of contact 20. This encourages gate current to spread out evenly along an appreciable peripheral area of the main region A.

To complete a commercially practical component, the device shown in FIGS. 1 and 2 can be mounted in an hermetically sealed insulating housing of any suitable design, with its electrodes 16, 17, and 19 being respectively connected to separate terminal members of the housing which members in turn are adapted to be connected to external electric circuits in which the device will be used. One example of an improved housing for this purpose is fully disclosed in a copending patent application Ser. No. 585,428—Sias filed on Oct. 10, 1966, and assigned to the assignee of the present invention.

Figure 3:
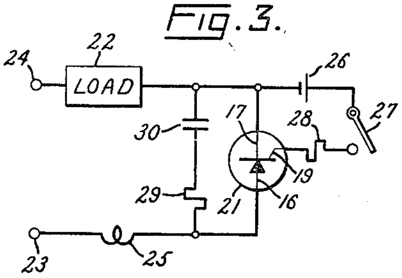
FIG. 3 is a schematic diagram of this device connected in an electric circuit.

Having described the physical structure of a semiconductor switching device embodying our invention, we next will explain its improved turn-on characteristics with reference to FIGS. 3 and 4. FIG. 3 is a schematic diagram of a semiconductor controlled rectifier 21 connected in series with a load 22 between a pair of electric power input or source terminals 23 and 24. Load *di/dt* limiting means, shown as an inductor 25, is also included in this series circuit. The illustrated rectifier 21 is symbolic of the previously described device 11. To turn this component on, a trigger signal is applied to its control electrode or gate 19 by a suitable source of energy represented in FIG. 3 by the serially connected combination of a D-C control current supply 26 (e.g., a battery), a normally-open switch 27, and a resistor 28. The negative terminal of the control current supply 26 is shown connected to the cathode 17 of the controlled rectifier 21, and the resistor 28 is connected to the gate 19, whereby the direction of conventional current flow on closing the switch 27 is into the gate and out of the cathode. Hereinafter we will refer to this as positive gate current. As it is depicted in FIG. 3, the controlled rectifier 21 is shunted by a conventional snubber circuit comprising a resistor 29 and a capacitor 30 in series, which circuit is often used to reduce the maximum rate of rise of forward anode voltage on the controlled rectifier. (Note that during the turn-on process, the discharge of the capacitor 30 will initially impose a high *di/dt* on the controlled rectifier.)

Whenever the controlled rectifier 21 is subjected to a forward bias voltage (the potential of the source terminal 23 being positive with respect to terminal 24), cathode current can be sufficiently increased by closing the switch 27 to cause the controlled rectifier to change abruptly from a blocking or off state to a conducting or on state, whereupon the gate 19 loses control until anode current in the rectifier is subsequently reduced below the holding current level and the device reverts to its forward blocking state. By utilizing our invention, this turn-on process can be accomplished at unusually low magnitudes of forward bias voltage and with unusually short delay times, without sacrificing any of the advantageous characteristics of prior art devices. The short delay time is illustrated in FIG. 4 wherein the time traces 31 and 32 represent, respectively, the anode voltage and the gate voltage of a typical device embodying our invention. The device tested had a rating of over 250 amperes and 1800 PRV, and a forward bias voltage of 15 volts D-C was used. At time $t_0$ the switch 27 in the control circuit was closed. The resulting positive gate current had a magnitude of approximately 1 amp., and gate-to-cathode voltage was initially 15 volts. Load current increased from zero at a rate of 1 amp. per microsecond. The elapsed delay time was approximately 0.1 microsecond.

A sampling of devices constructed in accordance with our invention reveals that they consistently turn on when triggered by a very short-duration pulse of positive gate current and that they have uniformly low turn-on voltages. Although successful switching can be achieved by energizing the gate with a positive trigger signal as small as 0.1 amp. at 2 volts, overdriving is preferred for most applications presently contemplated. In this manner we can obtain a *di/dt* capability at least as good as that attained in practicing the above-mentioned DeCecco et al. invention.

Two distinguishing characteristics of our invention warrant re-emphasis at this point. We have been able to produce in quantity devices whose respective delay times are not only unusually short (none longer than approximately 0.3 microsecond under normal operating conditions) but also nearly equal to one another. By nearly equal we mean within a band of approximately 0.3 microsecond. Such consistency is a real advantage to power circuit designers and users for many of the practical applications of switching devices noted in the introductory portion of the present specification. Furthermore, the improved performance of our devices has been achieved within the basic framework of existing manufacturing facilities and processes and without impairing the high voltage and current ratings heretofore attained.

With reference to FIG. 5, we will now offer an explanation of the turn-on process that probably takes place in the above-described device and that theoretically accounts for the observed improvements in its switching characteristics. FIG. 5 is a hybrid diagram similar to FIG. 1 except that the main and auxiliary regions A and B of the N-type semiconductor layer at the cathode end of the device are shown remote from each other but conductively interconnected by a resistor R. The resistor R represents a path of relatively high lateral resistance provided by the etched auxiliary region B for gate current between the control electrode contact on the exposed face of this region and the cathode 17. In FIG. 5 the rectifying (PN) junction between the auxiliary region B and the contiguous P layer of the device is labeled J3′, and when positive gate voltage $V_g$ is first applied this junction is reverse biased. The resulting depletion region or space charge has been depicted by the parallel broken lines on opposite sides of J3′. The broken lines embracing the blocking junction J2 between the internal N and P layers 13 and 14 of the device delineate a depletion region or space charge established there by forward bias voltage applied to the anode 16 prior to triggering the device.

When the metallic control electrode (gate) 19 is brought into direct contact with the face of our semiconductor region B, a connection exhibiting the characteristics of a rectifier junction is formed therewith. Such a metal-semiconductor junction is sometimes referred to as a Schottky diode. Apparently the part of the N-type auxiliary region B in contact with the gate 19 acts as an inversion layer, or, as we have illustrated in FIG. 5, a shallow zone 33 of this region is inverted to P-type conductivity, thereby creating a rectifier junction J4. The existence of this non-ohmic contact can be confirmed by measuring its voltage-current characteristic, and a typical characteristic 34 has been reproduced in FIG. 6*a*. One possible explanation for its existence is that the abutting metal 19 causes sufficient attrition of electrons from the moderately doped N-type semiconductor material just inside the surface of the region B to deplete the zone 33 and consequently invert it to P-type behaviour.

On applying positive excitation to the gate 19, the following events occur sequentially but virtually simultaneously. The junction J4 is forward biased, and the metal-semiconductor contact, or the P-type zone 33, emits holes which are injected into the N-type auxiliary region B, as is indicated in FIG. 5 by the arrow 35. These holes comprise minority carriers in the region B, and being in close proximity to the reverse-biased junction J3′, most of them are immediately influenced by its space charge and transported across this junction into the adjoining P-type layer 14, as indicated by the arrow 36. (The minority carrier transit time is extremely short because of the relatively small distances involved and because of the accelerating effect of the space charge under the gate contact. Furthermore, the transport efficiency is very high because the part of the auxiliary region B traversed by the holes is so thin and because the surrounding material of the original N-type end layer having a relatively high density of recombination centers was removed when the auxiliary region was formed by surface etching.) In accordance with known principles, the injection of holes 36 into the P-layer 14 will be accompanied by simultaneous ejection of an equal quantity of holes from the same layer. So long as the PN junctions J2 and J3′ are both reverse biased, this equal quantity of holes will prefer to cross the junction J3 into the N-type main region A, as indicated by the arrow 37. This hole current is in the forward direction across J3 and necessarily results in minority carriers (electrons) being contemporaneously injected into the P-layer 14 from the main region A, as is indicated by the broken arrow 38. (It will be observed that, compared to the auxiliary region B, the main region A has a higher impurity concentration and is a better electron emitter, serving in effect like a reservoir of free electrons for forced injection across the forward-biased junction J3 into the adjoining P layer 14. At the same time some electron current 39 will flow from the main region through the lateral resistor R to the gate 19, but because of the high resistance of this path the magnitude of wasted current traversing it is negligible.) A significant fraction of the quantity of free electrons 38 injected into the P layer 14 quickly diffuses toward the space charge of the reverse-biased junction J2 where it is swept across this junction and injected into the internal N layer 13 (see the broken arrow 40). The consequential cascade of carriers across the blocking junction J2 discharges the space charge in the vicinity of the arrow 40 and allows the device to start conducting anode current through this broad area region of the semiconductor body. As anode current increases it can rapidly spread laterally from the initially conducting region across the whole area of the device.

This single-step turn-on action is unusually efficient and fast, and it coincidentally results in a shorter turn-off delay. The critical magnitude of gate current that will successively trigger the device can be controlled by the above-mentioned etching of the auxiliary region B and by the position and size of the gate contact thereon. These parameters determine the lateral resistance between the gate contact and the main region A. The thinner the auxiliary region the lower the critical gate current but the higher the gate voltage required to produce it. After selecting a desired gate current, the initial turn-on area of the device can be enlarged and the delay time and turn-on voltage both reduced by overdriving the gate. The voltage-current characteristic of the gate is also affected by the degree of etching done before the control electrode is attached to the exposed face of the auxiliary region.

As previously mentioned, the non-ohmic contact between the control electrode 19 and the auxiliary region B of the N-type end layer 15 of the semiconductor body 11 is preferably obtained by welding an aluminum wire directly to the exposed face 18 of the auxiliary region. We think that the selection of aluminum is advantageous because it not only is capable of bonding to silicon but also is an acceptor. The use of aluminum, or any bondable metal containing an acceptor type of impurity, probably enhances the formation of the inversion zone 33 in the auxiliary region adjacent to the control electrode. Other metals so characterized include gallium, indium, gold, copper, zinc, or brass. If a complementary arrangement were desired, wherein the metallic control electrode is connected to an auxiliary region of a P-type end layer, then the part of the control electrode that contacts the exposed face of this semiconductor region should preferably comprise a metal characterized as a donor. Such metals include phosphorous, arsenic, antimony, tungsten, and nickel.

An examination of FIG. 5 suggests the alternative possibility of obtaining a non-ohmic junction between the control electrode 19 and the N-type auxiliary region B by adding a thin zone of semiconductor material having P-type conductivity on a limited area of the face of this region between it and the control electrode. Such a modified form of our invention has been shown in FIG. 7 which is essentially the same as FIG. 1 except for a narrow zone 41 of P-type semiconductor material on the face 18 of the auxiliary region B of the end layer 15 of the device **11*a*. The control electrode 19 has been connected to the added zone 41** which is electrically in series therewith, and the turn-on process of the modified device is like that of the first form of our invention previously described.

The added zone 41 in FIG. 7 can be deposited by a known epitaxial technique or the like, whereby a rectifying (PN) junction is formed between it and the contiguous region B. Note that a gap is maintained between this zone and the border of the thicker main region of the end layer 15, whereby the lateral resistance of the auxiliary region between the periphery of the control electrode contact and the main region remains high compared to the corresponding parameter of the main region. If desired, the auxiliary region B and its thin and narrow overlay 41 could be extended along an appreciable border length of the main region. Many different configurations are possible. For example, a ring-like auxiliary region could circumscribe a circular main region, with the zone 41 being a narrow annular band concentrically disposed on this auxiliary region.

FIGS. 8 and 9 illustrate another alternative form of the invention. The device **11*b* shown in these two figures is similar to that shown in FIGS. 1 and 2 except that the auxiliary region B of the end layer 15 has been made circular and is located inboard with respect to the gold cathode 17 overlaying the adjoining main region A. This can conveniently be done by etching an aperture in the original cathode 17. The auxiliary region B is exposed through this aperture, and its face 18 is therefore completely circumscribed by both the main region A and the cathode 17 of the device. Centrally the face of this auxiliary region B is in non-ohmic contact with the control electrode 19. As before, the face 18 extends laterally beyond the periphery of the control electrode contact 20, and the portion of the end layer 15 subtending this face is appreciably thinner than any bordering portion of the main region A. If desired, the auxiliary region B shown in FIGS. 8 and 9 can be concentrically located on the axis of the disk-like semiconductor body 11*b***.

The FIG. 10 configuration of the auxiliary region B is presently preferred, because it involves the least change in existing production facilities, methods, and parts. FIG. 10 shows a device **11*c* wherein a peripheral segment of the cathode 17 has been removed by etching and a conforming segment of the end layer 15 of semiconductor material has been additionally etched to form the auxiliary region B of our invention. This auxiliary region measures about 0.1 inch across, and a central part of its exposed face 18 is in non-ohmic contact with the control electrode 19** at one or more points.

Another form of the invention is illustrated in FIG. 11. In this device **11*d*, high lateral resistance between the main region A of the end layer 15 and the part of the N-type auxiliary region B in contact with the control electrode 19 is obtained by circumscribing the auxiliary region being spaced from the main region by a gap 42** devoid of any semiconductor material.

Turning next to FIGURE 12, we have shown a device 11*e* that has two spaced-apart diametrically disposed auxiliary regions B1 and B2 in the periphery of its upper end layer of semiconductor material. This device is equipped with a control electrode 19 having two different parts or branches 43 and 44. The exposed face of the auxiliary region B1 is in non-ohmic contact with the wire comprising part 43 of the control electrode, and the exposed face of the second auxiliary region B2 is in non-ohmic contact with the wire comprising the parallel part 44 of the control electrode. Both auxiliary regions and their respectively associated control electrode contacts are constructed and arranged in accordance with the precepts previously explained in connection with the description of FIGS. 1–5. The FIG. 12 embodiment is intended to double the initial turn-on area of the device and hence to further improve its *di/dt* capability. Of course still more auxiliary regions could be employed if desired, and at least one of them could be inboard.

In order to reduce the magnitude of gate voltage required to produce the desired quantity of positive gate current for spontaneously triggering our device, we have found it sometimes an advantage to use a multi-gate arrangement like that shown in either FIG. 13 or FIG. 14. Both figures show devices wherein there are at least two spaced-apart points of direct contact between an auxiliary region and its control electrode. In FIG. 13 the exposed face of the auxiliary region B of the device 11*f* is in non-ohmic contact with each of two different parts or branches 43 and 44 of the control electrode 19. The device 11*g* shown in FIG. 14 is provided with an auxiliary region B whose exposed face has limited area in non-ohmic contact at 20*a*, 20*b*, and 20*c* with three separate parts of a wire 19 that comprises the control electrode; if desired the auxiliary region B could completely circumscribe the main region A, and additional points of contact with the wire 19 could be provided on the annular face of the former. The several areas of contact with the control electrode are preefrably located with respect to the border between the main and auxiliary regions of the device so that an appreciable length of the border is substantially equidistantly spaced therefrom. This improves the distribution of gate current flowing between the cathode 17 and the control electrode 19 and thereby ensures the start of load current conduction in a broad area region of the semiconductor body subtending a substantial width of cathode 17. To ensure equal sharing of gate current, balancing impedances can be added in the respective branches 43 and 44 of the control electrode shown in FIG. 13. However, we have observed that the multi-gate arrangement improves switching performance even without equal current sharing, probably because the contacts that initially conduct least current nevertheless contribute a significant quantity of minority carriers to the N-type auxiliary region B, thereby preconditioning additional area for an almost instantaneous spread of load current when conduction begins.

As another possible way of practicing our invention, the gate contacts 20*a* and 20*c* shown in FIG. 14 could be interconnected by a wire or a narrow strip of metal in continuous contact with the exposed face of the auxiliary region B.

FIG. 15 is a schematic circuit diagram of a parallel array of semiconductor switching devices 21 constructed in accordance with our invention. Three such controlled rectifiers have been shown, and they are jointly connected between an anode bus 45 and a cathode bus 46 that can also serve as common heat sinks for the rectifiers. The anode bus 45 is connected to one input terminal 47 of a source of electric power, and the cathode bus 46 in series with an extra high current load 48 is connected to another input terminal 49 of the power source. The gate 19 of each rectifier 21 is connected via a separate impedance 50 (shown as a resistor) to a common source of positive gate current which in FIG. 15 is represented by a normally open switch 51 and a battery 52 whose negative pole is connected to the cathodes of the respective rectifiers. Of course any suitable gate current source could be used, such as a transformer secondary winding in series with a diode. With forward bias voltage applied to the input terminals 47 and 49, load current conduction can be initiated by closing the switch 51 and thereby triggering all three rectifiers 21. (While not shown in FIG. 15, a conventional snubber circuit can be connected across the parallel array of controlled rectifiers 21, and load *di/dt* limiting inductance can be connected in series therewith.)

The controlled rectifiers 21 shown in FIG. 15 are selected from a graded lot to ensure matching characteristics. The relative ohmic values of the respective impedances 50 are chosen to promote simultaneous turn-on or firing of the three rectifiers; if these values were all the same, the three impedances could be consolidated into a single equivalent one or omitted altogether. Because the delay times of our rectifiers are so consistent and so short, it is realistic to expect the three of them to turn on in unison. Thus they equally share total current in the anode bus during turn-on action. If one of the rectifiers were to assume more than its share of rising anode current during the joint turn-on process, all of the remainder have such low turn-on voltages that each can rapidly proceed to its fully conductive state even with forward bias voltage reduced to the level of the forward drop across the one turned on. Thus successful paralleling is achieved.

With reference finally to FIG. 16, yet another embodiment of our invention will now be described. In general this PNPN device 11*h* is similar to the first embodiment described above. One of the end layers 15 of semiconductor material is divided into at least two juxtaposed regions A and B of discretely different thicknesses. The main region A has a major face in broad-area ohmic contact with the metallic cathode 17, while the thinner auxiliary region B has an exposed minor face 18 that is free of cathode connections. For purposes of triggering the device, the exposed face 18 of the auxiliary region of its end layer is in non-ohmic contact with a metallic control electrode 19 (e.g., an aluminum wire).

The physical construction of the auxiliary region B in the N-type end layer 15 of the device 11*h* is essentially like that of the device 11 shown in FIG. 1. We again etch this region to reduce the thickness of the semiconductor layer 15 circumscribing the part of its surface 18 on which the control electrode impinges, thereby increasing the lateral resistance of the auxiliary region. However, as is clearly shown in FIG. 16, the control electrode contact 20 has been located on a mesa-like part of the exposed face 18 that is not depressed with respect to the major face of the adjoining main region A. Preferably this result is accomplished by connecting the wire 19 to the auxiliary region B before completing the etching of its surface. The removal of semiconductor material to the right of the control electrode contact 20 (as viewed in FIG. 16) will reduce undesirable control current leakage over the relatively low-resistance exterior surface of the adjacent P-type layer 14 of the device.

In FIG. 16 the anode 16 and the cathode 17 of the device 11*h* are shown connected to an external circuit comprising electric power input terminals 53 and 54 and a load 55. To turn the device on, a trigger signal is applied to the exposed face 18 of its auxiliary region B by a suitable source of energy that comprises, for example, the combination of a D-C control current supply 56 (e.g., a battery), a normally open switch 57, and a resistor 58 serially connected between the cathode 17 and the control electrode or gate 19 of the device. However, this embodiment of our invention is adapted to be fired by negative gate current, and therefore, as can be seen in FIG. 16, the positive pole of the battery 56 is connected to the cathode 17.

Whenever the anode 16 of the device 11*h* is subjected to a forward bias voltage, cathode current can be sufficiently increased by closing the switch 57 to cause the device to change abruptly from a blocking or off state to a conducting or on state. The turn-on characteristics of this embodiment have been found to differ from those previously described as follows: (1) the delay time is not as short, (2) the turn-on voltage is lower, and (3) the minimum magnitude of negative gate current required to trigger the device is lower.

We will now offer a brief explanation of the turn-on process that probably takes place in the FIG. 16 embodiment of our invention. The direct contact 20 between the metallic gate 19 and the minor face 18 of the semiconductor region B results in a non-ohmic junction therebetween. The existence of this non-ohmic contact can be confirmed by measuring its voltage-current characteristic; a typical gate-cathode characteristic 59 of the device shown in FIG. 16 is reproduced in FIG. 6*b*. This characteristic is different from the characteristic 34 shown in FIG. 6*a* because less semiconductor material was removed from the original outer surface of the auxiliary region B prior to attaching the gate thereto. The original surface, as mentioned hereinbefore, is characterized by a lower resistivity than the interior portion of the end layer 15, and consequently in FIG. 16 the face of the auxiliary region B in contact with the gate lead 19 has a relatively low barrier potential.

On applying negative excitation to the gate 19, its non-ohmic junction with the axuiliary region B is reverse biased and a copious quantity of free electrons is injected into the N-type auxiliary region. The high lateral resistance of this region between the gate contact 20 and the cathode 17 ensures that most of these electrons are immediately transported across the forward biased PN junction under the region B and into the adjoining P-type layer 14 of the device. Many of the electrons injected into the layer 14 quickly diffuse toward the space charge of the blocking junction J2 between this layer and the internal N layer 13, whereupon electrons are swept across this junction and injected into the layer 13. (The negative gate voltage that is applied to the contact 20 increases the space charge of the blocking junction J2 in the vicinity of this contact, thereby augmenting whatever voltage is being applied to the anode of the device and allowing the above-described action to succeed with a lower forward bias voltage than would otherwise be possible.) The consequential cascade of carriers across the blocking junction J2 enables the device to start conducting anode current through the region of the semiconductor body subtending the gate contact 20. To reach the cathode 17, current necessarily passes laterally through the auxiliary region B, and as a result a voltage drop of substantial magnitude is developed across this region between the contact 20 and the cathode 17. The high lateral resistance of the auxiliary region B forces a significant fraction of the current initially traversing this region to immediately transfer to a prallel path comprising the adjoining P-type layer 14 and the PN junction J3 between it and the main region A of the N-type end layer 15 of the device 11*h*. This transferred current serves as a relatively large trigger signal for a broad area of the device under the cathode 17. Anode current will now transfer abruptly from the initially triggered area to the broad area portion of the device adjacent to a peripheral section of the main region A, and as this current increases in magnitude it can rapidly spread laterally across the whole area of the device.

It is apparent that triggering means other than the metallic control electrode 19 could be used. For example, a beam of light could be focused on the exposed face 18, thereby exciting the auxiliary region B of the FIG. 16 device. As was previously mentioned in connection with the description of FIGS. 13 and 14, a multigate arrangement can sometimes be advantageously used. By having more than one point of contact between the control electrode 19 and the exposed face 18 of the auxiliary region B, the initial turn-on area of the device will be increased and therefore its *di/dt* capability will be improved.

While various alternative forms of our invention have been shown and described in detail by way of illustration, other modifications will probably occur to those skilled in the art. For example, all conductivity types and polarities shown in the drawings could be reversed. The invention could be incorporated in PNPN devices made solely by diffusion or epitaxial techniques. It is possible to trigger our asymmetrically conductive switching device from a bipolar source of gate current, which may be desirable in some applications. Therefore, we contemplate by this application to cover all such modifications as fall within the true spirit and scope of our invention.

What we claim as new and desire to secure by Letters Patent of the United States is:

1. In a semiconductor switching device:

(a) an asymmetrically conductive semiconductor body having four layers of semiconductor material arranged in succession, with contiguous layers being of different conductivity types;

(b) a pair of spaced-apart main current carrying electrodes respectively connected to opposite end layers of said body;

(c) a predetermined one of said end layers comprising laterally adjoining main and auxiliary regions, (i) said main region being in broad area ohmic contact with the main electrode that is connected to said predetermined end layer, and (ii) said auxiliary region having an exposed face that is smaller in surface area than said main region and is free of any main electrode connections; and (d) a metallic control electrode connected to a limited area of said exposed face to form a rectifying contact with said auxiliary region;

(e) said limited area of said exposed face being spaced apart from the nearest border of said main region of said predetermined one end layer.

2. The device of claim 1 in which said auxiliary region is inboard with respect to the main region of said predetermined end layer, whereby the exposed face of said auxiliary region is circumscribed by said main region.

3. The device of claim 1 in which the auxiliary region of said predetermined end layer is so constructed and arranged that the electrical resistance between said main region and the part of said auxiliary region subtending said limited area is appreciably higher than that of any adjoining section of said main region having a lateral dimension corresponding to the shortest distance between the border of said main region and said limited area.

4. The device of claim 3 in which there are at least two spaced-apart auxiliary regions having exposed faces to which at least two different parts of the control electrode are respectively connected, each part of the control electrode being connected to a limited area of the corresponding face to form therewith a rectifying contact.

5. The device of claim 3 in which the exposed face of said auxiliary region extends laterally beyond the entire periphery of said limited area.

6. The device of claim 5 in which the portion of said predetermined end layer that subtends the exposed face of said auxiliary region is appreciably thinner than any bordering portion of said main region.

7. The device of claim 5 in which there is a thin zone of semiconductor material, of a conductivity type opposite to that of said predetermined end layer, over laying said limited area of the face of said auxiliary region, said zone being disposed between said auxiliary region and said control electrode in series therewith.

8. The device of claim 7 in which said main region is circular, said auxiliary region circumscribes said main region, and both said exposed face and said zone of semiconductor material are annular.

9. In a controlled rectifier:

(a) a pair of spaced-apart main electrodes;

(b) a disc-like body having four layers of semiconductor material arranged in succession between said electrodes, with contiguous layers being of different conductivity types whereby rectifying junctions are formed therebetween;

(c) a predetermined one of said end layers comprising at least two juxtaposed regions of discretely different thicknesses, (i) a first one of said regions having a major face of relatively broad area in contact with the main electrode that is connected to said predetermined end layer, and (ii) another of said regions having a minor face that is generally parallel to the plane of said major face, said minor face being free of main electrode connections; and (d) means impinging only a limited area of said minor face for triggering the controlled rectifier, said triggering means including a rectifying contact with said other region;

(e) said other region being so constructed and arranged that (i) said limited area of its minor face is surrounded by a barren peripheral area of said minor face, whereby the limited area on which said triggering means impinges is set back by at least a predetermined minimum distance from the perimeter of said minor face and from any bordering portions of said first regions, and (ii) the portion thereof subtending said peripheral area of said minor face is appreciably thinner than the bordering portions of said first region.

10. The controlled rectifier of claim 9 in which said thinner portion is disposed under an etched-out recess in the original outer surface of said predetermined end layer, whereby the thickness of said other region is reduced.

11. The controlled rectifier of claim 9 in which said triggering means comprises an elongated metallic conductor in direct contact with said limited area of said minor face.

12. The controlled rectifier of claim 9 in which the border between said juxtaposed regions has an appreciable length substantially equidistantly spaced from said area of impingement.

13. The controlled rectifier of claim 9 in which said triggering means includes a thin zone of semiconductor material, of a conductivity type opposite to that of said predetermined one end layer, overlaying only said limited area of said minor face of said other region.

14. In a controlled rectifier:

(a) an asymmetrically conductive semiconductor body having four layers of semiconductor material arranged in succession, with contiguous layers being of different conductivity types;

(b) a predetermined end layer of said body comprising a main region having a broad area major face and a laterally adjoining auxiliary region having a minor face;

(c) a pair of spaced-apart main current carrying electrodes in broad area ohmic contact with said major face and with the opposite end layer of said body, respectively; and (d) a control electrode comprising a metallic wire in rectifying contact with said minor face;

(e) the lateral resistance of said auxiliary region, measured from any point of contact with said wire to the nearest border of said main region, being higher than the corresponding parameter of said main region.

15. The controlled rectifier of claim 14 in which said predetermined end layer is of N type conductivity and the part of said wire that contacts said minor face comprises a metal characterized as an acceptor.

16. The controlled rectifier of claim 14 in which said predetermined end layer is of P type conductivity and the part of said wire that contacts said minor face comprises a metal characterized as a donor.

17. The controlled rectifier of claim 14 in which said auxiliary region is characterized by a resistivity higher than that of said main region.

18. The controlled rectifier of claim 14 in which said wire is welded to said minor face at one or more points.

19. The controlled rectifier of claim 14 in which there are at least two spaced-apart points of direct contact between said minor face and different parts of said control electrode.

20. The controlled rectifier of claim 14 in which said auxiliary region is disposed under a recess in the original outer surface of said predetermined end layer adjoining said major face.

21. In a controlled rectifier:

(a) a pair of spaced-apart main electrodes;

(b) a disc-like body having four layers of semi-conductor material arranged in succession between said electrodes, with contiguous layers being of different conductivity types whereby rectifying junctions are formed therebetween, the areas of the respective junctions are formed therebetween, the areas of the respective junctions being at least as large as the lateral area of a predetermined one of the opposite end layers of said body;

(c) said predetermined end layer comprising at least two juxtaposed regions of discretely different thicknesses, (i) a first one of said regions having a major face of relatively broad area in contact with the main electrode that is connected to said predetermined end layer, and (ii) another of said regions having a minor face that is generally parallel to the plane of said major face, said minor face being free of main electrode connections; and (d) electromagnetic radiation means impinging only on a limited area of said minor face for triggering the controlled rectifier;

(e) said other region being so constructed and arranged that (i) said limited area of its minor face is surrounded by a barren peripheral area of said minor face, whereby the limited area on which said electromagnetic radiation means impinges is set back by at least a predetermined minimum distance from the perimeter of said minor face and from any bordering portions of said first region, and (ii) the portion thereof subtending said peripheral area of said minor face is appreciably thinner than the bordering portions of said first region.

22. In a controlled rectifier:

(a) a thin semiconductor body having four layers of semiconductor material arranged in succession, with contiguous layers being of different conductivity types;

(b) a pair of spaced-apart main electrodes respectively connected to opposite end layers of said body;

(c) a predetermined one of said end layers comprising juxtaposed main and auxiliary regions both of which are contiguous with the intermediate layer of said body that adjoins said predetermined end layer, said main region having a major face in broad area contact with the main electrode that is connected to said predetermined end layer, and said auxiliary region having a minor face which is generally parallel to said major face and free of main electrode connections; and (d) a metallic control electrode in contact with only a limited area of said minor face of said auxiliary region;

(e) said minor face being depressed with respect to the plane of said major face and said limited area being spaced apart from said main region, whereby the control electrode contact on said auxiliary region is disposed in the proximity of said intermediate layer and relatively remotely from the adjacent main region of said predetermined end layer.

23. The controlled rectifier of claim 22 in which said auxiliary region is disposed under an etched-out recess in the original outer surface of said predetermined end layer, whereby said minor face of said auxiliary region is depressed.

24. The controlled rectifier of claim 22 in which said control electrode contact is set back at least ten miles from any edge of said minor face.

25. The controlled rectifier of claim 22 in which the contact between said control electrode and said minor face is a rectifying contact.

26. In a controlled rectifier:

(a) a semiconductor body including four layers of semiconductor material arranged in succession, with contiguous layers being of different conductivity types;

(b) a first main electrode connected to a predetermined end layer of said body;

(c) a second main electrode connected to the opposite end layer of said body; and (d) a metallic control electrode spaced from said first main electrode but also connected to said predetermined end layer;

(e) said predetermined end layer comprising (i) a main region in ohmic contact with said first main electrode, and (ii) a laterally adjacent auxiliary region of reduced thickness in rectifying contact with said control electrode, said rectifying contact being spaced apart from said main region and said auxiliary region being so constructed and arranged that its lateral resistance between the part thereof that subtends said rectifying contact and the adjacent part of the thicker main region is appreciably higher than if the thickness of the auxiliary region were not reduced.

27. In combination, a plurality of controlled rectifiers connected in electrically parallel relationship with each other between physically spaced-apart anode and cathode buses, each of said rectifiers comprising:

(a) an asymmetrically conductive semiconductor body having four layers of semiconductor material arranged in succession, with contiguous layers being of different conductivity types;

(b) a pair of main electrodes connected between said anode and cathode buses and opposite end layers of said body, rtspectively; and (c) a metallic control electrode connected to a predetermined one of said end layers;

(d) said predetermined end layer comprising juxtaposed main and auxiliary regions, (i) said main region being contiguous and substantially coextensive with the main electrode that is connected to said predetermined end layer to form therewith a broad area ohmic contact, and (ii) said auxiliary region being free of main electrode connections and having an exposed face to which said control electrode is connected to form therewith a rectifying contact that is spaced apart from the nearest border of said main region, said auxiliary region being so constructed and arranged that the electrical resistance between the part thereof subtending said rectifying contact and the main region of said predetermined end layer is appreciably higher than that of any adjacent section of said main region having a lateral dimension corresponding to the shortest distance between said rectifying contact and the border of said main region.

28. In a semiconductor switching device:

(a) first and second spaced-apart current and heat conducting members;

(b) a plurality of controlled rectifiers connected in parallel array between said members, each rectifier comprising (i) an asymmetrically conductive semiconductor body including four layers of semiconductor material arranged in succession, with contiguous layers being of different conductivity types, (ii) a first main electrode connected to a predetermined end layer of said body, (iii) first means of negligible impedance for connecting said first electrode to said first member, (iv) a second main electrode opposite said first electrode connected to the opposite end layer of said body, said second main electrode and said opposite end layer being substantially coextensive with one another, and (v) second means of negligible impedance for connecting said second electrode to said second member, (vi) said predetermined end layer comprising a main region having a major face that is substantially coextensive and in contact with said first main electrode and a laterally adjacent auxiliary region of reduced thickness having a minor face that is generally parallel to the plane of said major face, said minor face being free of main electrode connections; and (c) means impinging directly on only a limited area of the minor face of each of said rectifiers for simultaneously triggering said rectifiers, said limited area in each rectifier being set back by at least a predetermined minimum distance from the perimeter of the corresponding minor face.

29. In a high-current controlled rectifier:

(a) a first annular main electrode and a second main electrode spaced apart therefrom;

(b) a thin disc-like multilayer body of semiconductor material disposed between said electrodes, said body having a first and second opposite end layers connected to said first and second electrodes, respectively, and first and second intermediate layers arranged in succession between said end layers, with contiguous layers being of different conductivity types whereby a series of three rectifying junctions are formed between said first and second end layers, the junction between said first end layer and the contiguous intermediate layer having a lateral area that is substantially coextensive with said first end layer;

(c) said first end layer comprising laterally adjoining regions of discretely different thicknesses, (i) one of said regions having a major face conforming to the annular main electrode and being in broad area contact therewith, and (ii) the adjoining region being disposed inboard with respect to said one region and being appreciably thinner than any bordering portion of said one region, said inboard region having an exposed face that is depressed with respect to said major face; and (d) electromagnetic radiation means impinging directly on the exposed face of said inboard region for triggering the controlled rectifier.

References Cited

UNITED STATES PATENTS

| | | | |
|---|---|---|---|
| 3,296,502 | 1/1967 | Gross et al. | 250—211 |
| 3,328,584 | 6/1967 | Weinstein | 317—235 |
| 3,391,310 | 7/1968 | Gentry | 317—235 |
| 3,401,320 | 9/1968 | Weinstein | 317—235 |
| 2,993,154 | 7/1961 | Goldey et al. | |
| 3,044,147 | 7/1962 | Armstrong. | |
| 3,176,147 | 3/1965 | Miller. | |
| 3,381,186 | 4/1968 | Arends. | |

FOREIGN PATENTS

| | | |
|---|---|---|
| 155,236 | 8/1962 | U.S.S.R. |
| 1,324,783 | 3/1963 | France. |

OTHER REFERENCES

Electronics, Mar. 1, 1963, p. 39.

"Silicon Rectifier Controls Power in Either Direction," Electronics, Dec. 20, 1963, p. 63, by Luscher et al.

JERRY D. CRAIG, Primary Examiner

U.S. Cl. X.R.

307—305, 311